(12) United States Patent
McGrath et al.

(10) Patent No.: US 7,378,999 B1
(45) Date of Patent: May 27, 2008

(54) METHOD AND APPARATUS FOR DIGITAL CALIBRATION OF AN ANALOG-TO-DIGITAL CONVERTER

(75) Inventors: John McGrath, Santa Clara, CA (US); Anthony J. Collins, Dundrum (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/714,361

(22) Filed: Mar. 6, 2007

(51) Int. Cl.
*H03M 1/10* (2006.01)
(52) U.S. Cl. .................................. 341/120; 341/155
(58) Field of Classification Search ......... 341/120–155
See application file for complete search history.

(56) References Cited

U.S. PATENT DOCUMENTS 6,081,215 A * 6/2000 Kost et al. ............ 341/120
6,351,228 B1 * 2/2002 Kutsuno et al. ........... 341/120
6,509,852 B1 * 1/2003 Todsen et al. ............. 341/120
6,784,824 B1 * 8/2004 Quinn ..................... 341/120
6,809,678 B2 * 10/2004 Vera et al. ................. 341/166

* cited by examiner

*Primary Examiner*—Lam T Mai
(74) *Attorney, Agent, or Firm*—Robert Brush

(57) ABSTRACT

Method and apparatus for digital calibration of an analog-to-digital converter (ADC). One example relates to calibrating an analog-to-digital (A/D) conversion system having an N-bit resolution. The A/D conversion system includes an ADC that generates an output having N most significant bits (MSBs) and M least significant bits (LSBs) (i.e., an N+M bit resolution). An offset calibration circuit is configured to determine an offset in the ADC and to compensate the N+M bit output using the offset to provide an N+M bit offset corrected output. A gain calibration circuit is configured to determine a gain correction factor for the ADC and to compensate the N+M bit offset corrected output using the gain correction factor to provide an N bit offset and gain corrected output.

20 Claims, 8 Drawing Sheets

US 7,378,999 B1

METHOD AND APPARATUS FOR DIGITAL CALIBRATION OF AN ANALOG-TO-DIGITAL CONVERTER

FIELD OF THE INVENTION

One or more aspects of the invention relate to analog-to-digital converters (ADCs) and, more particularly, to a method and apparatus for digital calibration of an ADC.

BACKGROUND OF THE INVENTION

An analog-to-digital converter (ADC) is an electronic circuit that converts an analog input voltage to a digital output. There are several quality metrics associated with an ADC, including gain, offset, differential non-linearity (DNL), and integral non-linearity (INL) errors. The offset of an ADC is the constant difference between the actual transfer function of the ADC and an ideal transfer function. The transfer function of an ADC is a plot of the analog input voltage (e.g., horizontal axis) versus the digital output codes (e.g., vertical axis).

FIG. 1 is a graph 100 illustrating the effect of offset error in an ADC. The graph 100 includes a horizontal axis 102 representing input voltage, and a vertical axis 104 representing digital output code. An ideal (unipolar) transfer function of the ADC is represented by plot 106. The transfer function 106 is not continuous, but is a plot of $2^N$ codes, where N is the resolution of the ADC. Thus, the transfer function 106 is a "stair-step" like plot. In practical ADCs, the transfer function 106 includes a ½ least significant bit (LSB) offset. That is, a line 108 drawn through the code transitions intersects the axis 102 ½ of an LSB from the origin. An offset error shifts the entire transfer function left or right along the input voltage axis. For example, an actual transfer function is represented by the plot 110. As the offset is a constant difference, it can be measured by using the intersection of the transfer function 110 with the horizontal axis when a ramp input stimulus is applied to the ADC. A line 112 drawn through the code transitions of the transfer function 110 begins at a point shifted to the right from the origin by the offset. Offset error can be positive or negative and is usually measured in volts or in terms of LSBs, which can be converted to voltage.

The gain of an ADC is the input-signal level-dependent error in the output transfer function. The gain is measured from the slope of the transfer function when a ramp input stimulus is applied to the ADC. FIG. 2 is a graph 200 illustrating the effect of gain error in an ADC. The graph 200 includes a horizontal axis 202 representing input voltage, and a vertical axis 204 representing digital output code. A line 206 represents the ideal (unipolar) transfer function, and a line 208 represents an actual transfer function having gain. The stair-step nature of the transfer functions has been omitted for clarity. The difference between the slope of the actual transfer function (slope of the line 208) and the slope of the ideal transfer function (slope of the line 206) is the gain error. Gain error can be positive or negative and is usually measured as a percent with respect to input signal level.

DNL error is a measure of the deviation of the width of an output code from the ideal. FIG. 3 is a graph 300 illustrating the effect of DNL error in an ADC. The graph 300 includes a horizontal axis 302 representing input voltage, and a vertical axis 304 representing digital output code. A plot 306 represents the ideal (unipolar) transfer function, and a plot 308 represents an actual transfer function. The width of each step in the ideal transfer function 306 is equally spaced for all codes. In the actual transfer function 308, widths of the steps vary. The DNL error is the value of the worst case deviation over all output codes. INL error is closely related to DNL error and is the running sum of DNL errors over all codes. INL error describes the deviation of the ramp transfer function from the ideal best-fit straight line or, specifically, the deviation of the actual code transitions from the ideal when offset and gain errors have been removed. The INL error is the value of the worst case deviation over all output codes.

Traditional techniques of calibrating an ADC to correct gain are performed in the analog domain, by either trimming or compensating the analog circuitry so that the errors are minimized. Digital correction of an ADC output is typically avoided. Present digital gain correction techniques introduce errors in the other ADC parameters, such as INL and DNL errors. For example, an ADC with 10-bit resolution ideally provides for 1024 steps of voltage between a minimum and maximum input voltage. The digital output codes range from 0 to 1023. If an ADC produces a code of 950 when the input voltage is at maximum (full scale) instead of 1023, then the ADC has gain error. Traditional digital gain correction attempts to map the output code range of 0 to 950 onto the desired range of 0 to 1023. Given the limited amount of source information, it is clear that by definition not all 1023 output codes can be represented. Thus, some codes will be missing along the transfer function and, as a result, the DNL and INL parameters are severely impacted. Accordingly, there exists a need in the art for a method and apparatus for digital calibration of an ADC that overcomes the aforementioned deficiencies.

SUMMARY OF THE INVENTION

Method and apparatus for digital calibration of an analog-to-digital converter (ADC) are described. One aspect of the invention relates to calibrating an analog-to-digital (A/D) conversion system having an N-bit resolution. The A/D conversion system includes an ADC that generates an output having N most significant bits (MSBs) and M least significant bits (LSBs) (i.e., an N+M bit resolution). An offset calibration circuit is configured to determine an offset in the ADC and to compensate the N+M bit output using the offset to provide an N+M bit offset corrected output. A gain calibration circuit is configured to determine a gain correction factor for the ADC and to compensate the N+M bit offset corrected output using the gain correction factor to provide an N bit offset and gain corrected output.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION OF THE DRAWINGS

Figure 1:
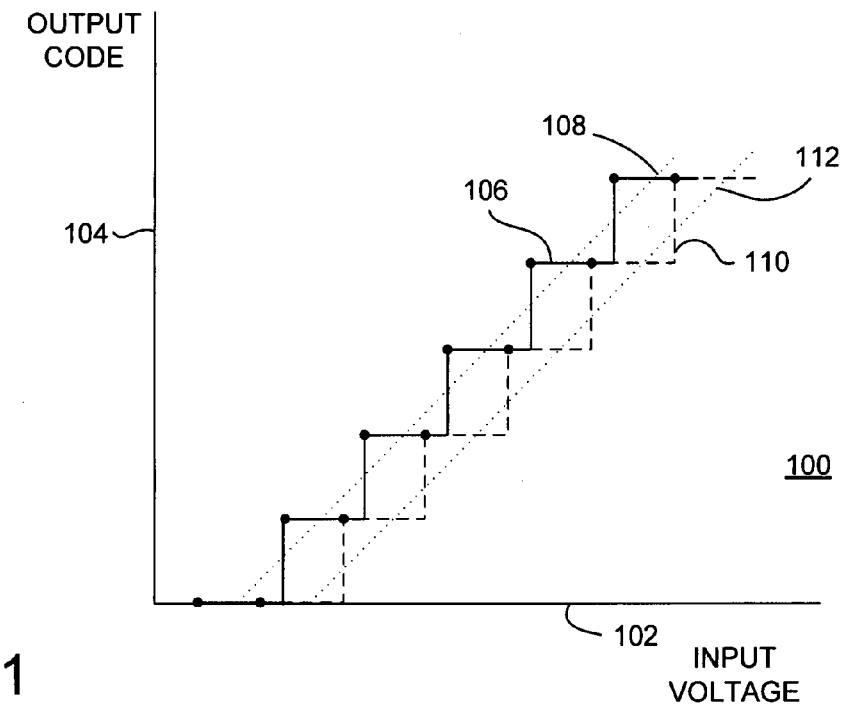
FIG. 1 is a graph illustrating the effect of offset error in an analog-to-digital converter (ADC)
Figure 2:
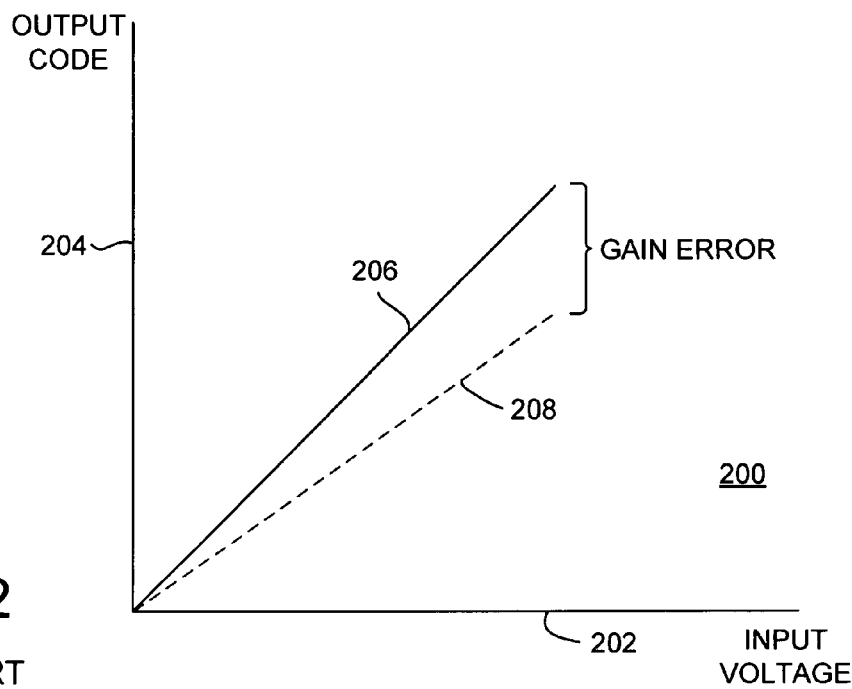
FIG. 2 is a graph illustrating the effect of gain error in an ADC.
Figure 3:
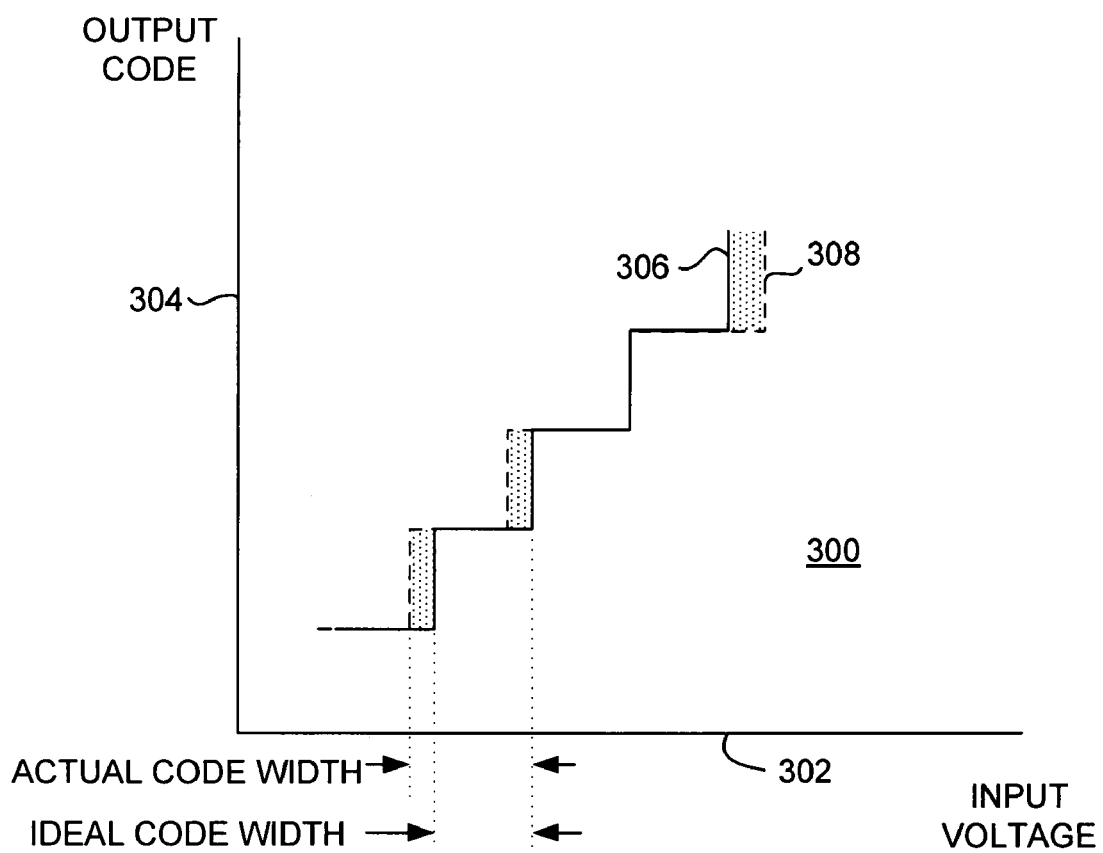
FIG. 3 is a graph depicting the effect of differential non-linearity (DNL) error in an ADC.
Figure 4:
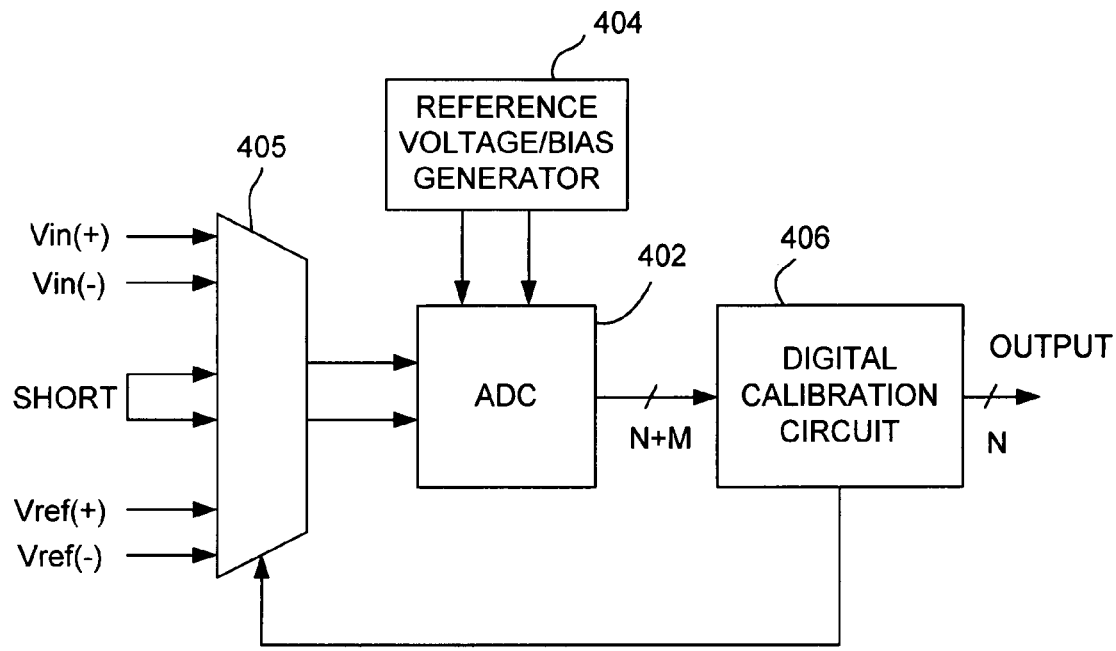
FIG. 4 is a block diagram depicting an exemplary embodiment of a conversion system in accordance with one or more aspects of the invention.

FIG. 4 is a block diagram depicting an exemplary embodiment of a conversion system 400 in accordance with one or more aspects of the invention. The conversion system 400 is configured to convert an analog input voltage to an N-bit digital output. The conversion system 400 includes an analog-to-digital converter (ADC) 402, a reference voltage/bias generator 404, a multiplexer 405, and a digital calibration circuit 406. The multiplexer 405 is an analog multiplexer with digital control. In the embodiment as shown, the inputs of the multiplexer 405 are differential inputs, each configured to receive a positive and negative component. One input of the multiplexer 405 is configured to receive an analog voltage in ($V_{IN}$) having a positive component, $V_{IN}$(+), and negative component, $V_{IN}$(−). The analog voltage (difference between positive and negative components) ranges between a minimum and a maximum value. The conversion system 400 may be a differential system, where the positive component is referenced to the negative component in each input signal (e.g., $V_{IN}$). Alternatively, the conversion system 400 may be configured as a single-ended system, where the positive component is referenced to ground in each input signal (e.g., $V_{IN}$). Although differential inputs are shown in the system 400, those skilled in the art will appreciate that the invention may be used with single ended inputs if only single-ended operation is required. As shown, the conversion system 400 is capable of operating in either differential or single-ended modes.

Another input of the multiplexer 405 is configured to receive a shorted signal (e.g., both positive and negative components are coupled to ground). An output of the multiplexer 405 is coupled to an input of the ADC 402. In particular, the output of the multiplexer 405 includes positive and negative components that are respectively coupled to positive and negative components of a differential input of the ADC 402. In one embodiment, the ADC 402 is capable of operating in both bipolar and unipolar modes. For single-ended input, a bipolar input signal to the ADC 402 swings above and below ground. For differential input, the positive component swings above and below the negative component. For single-ended input, a unipolar input signal ranges from zero-scale, which is ground, to full scale. For differential input, a unipolar input signal ranges from zero-scale, referenced to the negative component, to full scale.

The reference voltage/bias generator 404 is configured to provide a voltage reference ($V_{REF}$) and bias voltage for operation of the ADC 402. Another input of the multiplexer 405 is configured to receive positive $V_{REF}$(+) and negative $V_{REF}$(−) components of the reference voltage. The ADC 402 is configured to digitize the analog output of the multiplexer 405 to provide an N+M bit digital output, where N and M are integers greater than zero. Notably, the conversion system 400 is configured to work around the traditional issues related to the number of codes generated by an N-bit ADC not having enough information to produce the required number of output codes (i.e., $2^N$). This is achieved by generating M extra least significant bits (LSBs) from the ADC 402. That is, the digital output of the ADC 402 includes N most significant bits (MSBs) and M LSBs.

The digital output of the ADC 402 is coupled to the digital calibration circuit 406. The digital calibration circuit 406 is configured to compensate the digital output for offset error and gain error of the ADC 402. As described below, digital calibration circuit 406 calibrates based on the ADC 402 converting the reference voltage and the input ground reference. Accordingly, the digital calibration circuit 406 includes a control output coupled to the digital control input of the multiplexer 405. In one embodiment, the digital calibration circuit 406 also includes a control output coupled to a control input of the ADC 402 for selecting the mode of the ADC (i.e., unipolar or bipolar). The bipolar mode allows positive and negative offset error to be detected. The digital calibration circuit 406 generates an N-bit digital output. Notably, the digital calibration circuit 406 is configured to produce the required number of output codes, i.e., $2^N$, for a given range of analog input voltage. The M extra LSBs serve to increase the number of potential codes produced by the ADC 402 and, as a result, increase the number space that the digital calibration circuit 406 can use to correct the output transfer function.

The effect of gain error on DNL and INL may be understood with respect to the following example. Assume an ADC has a 4-bit resolution. Ideally, the ADC should be capable of producing 16 output codes. Assume, however, that the ADC can only output 13 codes due to gain error. Correcting these 13 output codes using traditional digital gain correction as described above still creates only 13 output codes, resulting in missing output codes. Due to the reduced number of output codes, the code widths in the transfer function are wider than average, which adversely affects the DNL. Three codes are missing entirely, which causes the DNL to be −1 and the ADC to fail linearity. INL will likewise be adversely affected.

In general, using an N-bit ADC output and correcting for gain results in DNL errors of at least ±1 LSB. For each extra bit M added, the number space is potentially increased by a factor of two, which in turn decreases the effect on the DNL error by a factor of two. Thus, using M=6 extra bits from the ADC 402 yields enough information to reduce the impact of gain calibration preformed by the digital calibration circuit 406 on the DNL by a factor of $2^6$ or 64. As a typical DNL for an ADC is in the range of 0.3 LSB, adding an extra error of 0.016 LSB is insignificant. INL will likewise be minimally affected.

Figure 5:
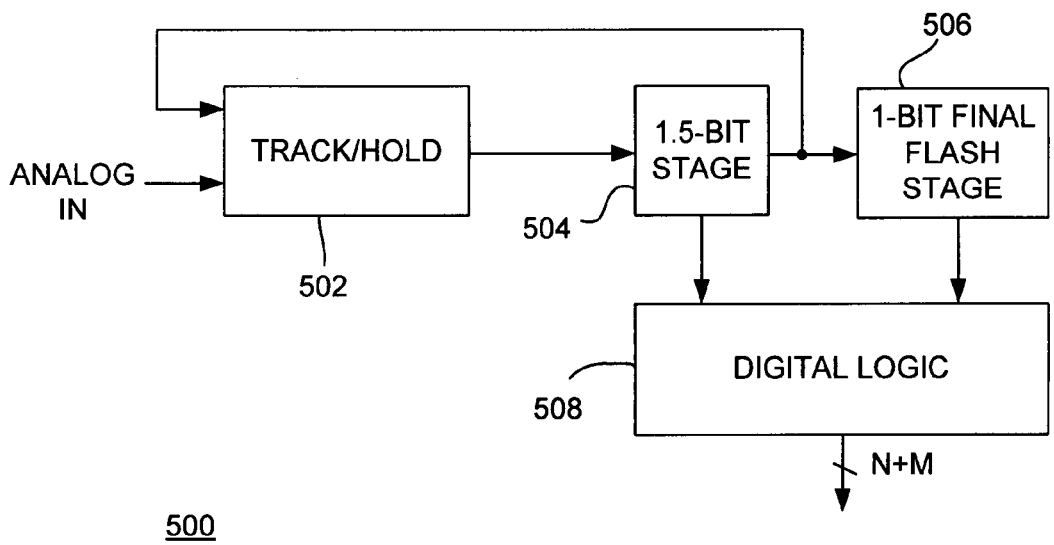
FIG. 5 is a block diagram depicting an exemplary embodiment of an ADC in accordance with one or more aspects of the invention.

FIG. 5 is a block diagram depicting an exemplary embodiment of an ADC 500 in accordance with one or more aspects of the invention. ADC 500 can be used, for example, to implement ADC 402 in the conversion system of FIG. 4. In this illustrative embodiment, the ADC 500 comprises a unipolar algorithmic successive approximation register (SAR) ADC. The ADC 500 includes a track/hold circuit 502, a 1.5 bit stage 504, a 1-bit flash stage 506, and digital logic 508. One terminal of the track/hold circuit 502 is configured to receive an analog input voltage. An output of the track/hold circuit 502 is provided to the 1.5 bit stage 504.

The 1.5 bit stage 504 is configured to resolve 1 bit with one-half bit overlap. The 1.5 bit stage 504 resolves the analog input into a 1.5 bit digital code. With a 1.5 bit resolution, only three codes are possible, e.g., 00, 01, and 10. The 1.5 bit stage 504 also generates an analog residue to be used for successive conversion. The digital output of the 1.5 bit stage 504 is provided to the digital logic 508. The analog output of the 1.5 bit stage 504 is provided to the 1-bit flash stage 506 and to another terminal of the track/hold circuit 502.

In operation, an N+M bit algorithmic ADC is formed by sampling the analog input signal on a first clock cycle, and sampling the output of the 1.5 bit stage 504 on the next N+M−1 clock cycles. The digital logic 508 sums the 1.5 bit data from each rotation with a 1-bit overlap such that the LSB from one rotation is added to the MSB from the next rotation. Each rotation of the ADC 500 resolves one effective bit from the MSB level down to the LSB-1 level. The final LSB bit may be resolved using the 1 bit flash stage 506, e.g., a comparator with its threshold set to 0 volts. The bit produced by the 1-bit flash stage 506 is not added, but rather is concatenated to the parallel data output by the digital logic 508. In general, an N+M bit algorithmic SAR ADC will require N+M comparison periods for a given input voltage. Those skilled in the art will appreciate that the SAR ADC 500 is a simplified description and is merely illustrative. It is to be understood that other types of ADCs may be used to generate an N+M bit output. Exemplary ADCs that may be used to generate an N+M bit output are described in commonly-assigned U.S. Pat. No. 6,784,824, issued Aug. 31, 2004, which is incorporated by reference herein.

Returning to FIG. 4, in one embodiment, the ADC 402 comprises an algorithmic SAR ADC. An algorithmic SAR ADC is suitable for producing the M extra LSBs, as it generally only requires M extra comparison periods to generate the extra bits. An algorithmic ADC can be configured to efficiently generate the additional M bits of information that is used to perform digital gain calibration, as described below. The algorithmic ADC is efficient in terms of both cost and implementation area. Those skilled in the art will appreciate that other types of ADCs may also be employed to generate an N+M bit digital output. For example, a pipelined ADC may also be employed that includes extra stages for the M LSBs or a last stage comprising, for example, a 3-bit flash ADC.

Figure 6:
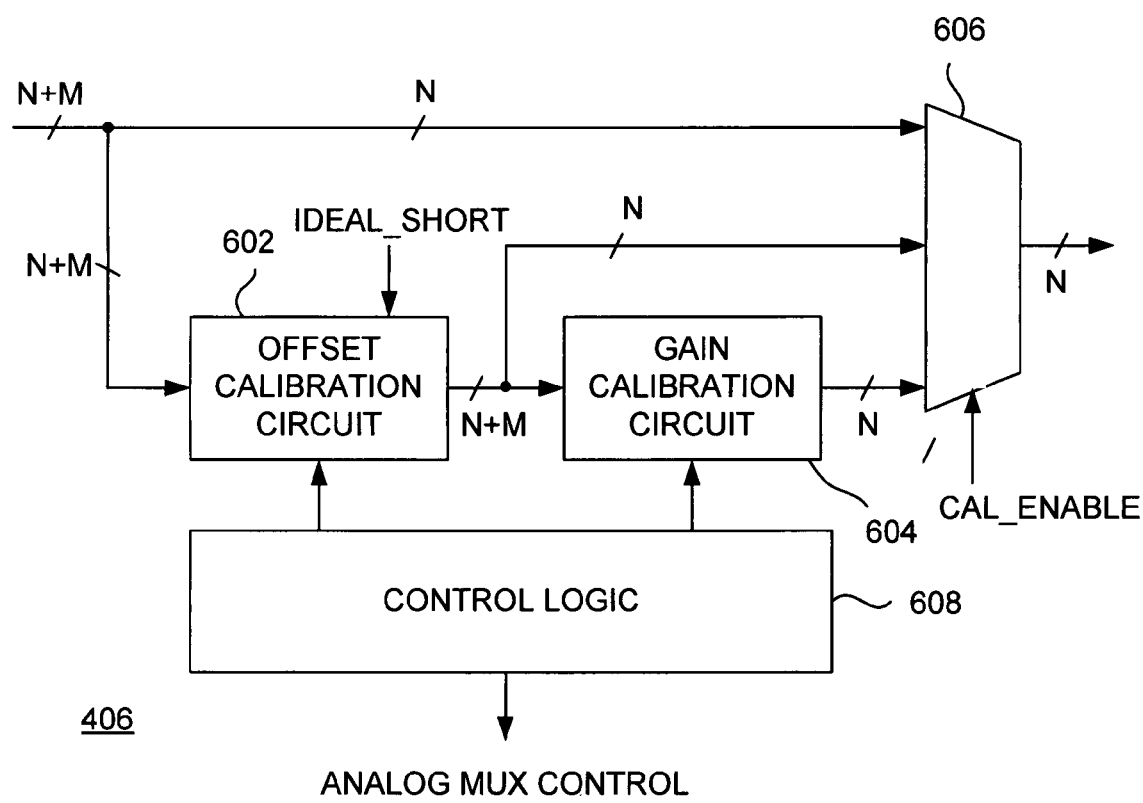
FIG. 6 is a block diagram depicting an exemplary embodiment of a digital calibration circuit in accordance with one or more aspects of the invention.

FIG. 6 is a block diagram depicting an exemplary embodiment of the digital calibration circuit 406 in accordance with one or more aspects of the invention. The digital calibration circuit 406 includes an offset calibration circuit 602, a gain calibration circuit 604, a multiplexer 606, and control logic 608. Inputs of the offset calibration circuit 602 receive the N+M bit digital output of the ADC 402 and an ideal output code. An output of the offset calibration circuit 602 is coupled to an input of the gain calibration circuit 604 and an input of the multiplexer 606. The gain calibration circuit 602 is configured to receive N+M bits of the output produced by the offset calibration circuit 602. The multiplexer 606 only receives the N MSBs of the output produced by the offset calibration circuit 602.

An output of the gain calibration circuit 604 is coupled to an input of the multiplexer 606. The output of the gain calibration circuit 602 comprises N bits. Another input of the multiplexer 606 is configured to receive the N MSBs of the digital output of the ADC 402. A control input of the multiplexer 606 is configured to receive a 2-bit control signal, cal_enable. The control logic 608 is coupled to the offset calibration circuit 602 and the gain calibration circuit 604. The control logic 608 is also configured to provide a control signal for controlling the analog multiplexer 405, and a control signal for controlling the mode of the ADC 402.

To initiate offset calibration, the control logic 608 causes the multiplexer 405 to select the shorted signal as input to the ADC 402 (see FIG. 4). The offset calibration circuit 602 is configured to compensate the digital output of the ADC 402 for offset error. Since the shorted signal is a known input (e.g., ground), the ideal output code for the ground reference is also known. The value of the ideal output code depends on the mode of the ADC 402. In unipolar mode, the ideal output code is a zero code. In bipolar mode, the ideal output code is a mid-scale code. Bipolar mode is best suited for measuring the offset, as it allows for both positive and negative offset to be measured. Accordingly, in one embodiment, the control logic 608 causes the ADC 402 to be in bipolar mode for measuring the offset. The output code produced by the ADC 402 when converting the shorted signal is compared with the ideal code for the shorted signal (ideal_short). Any difference between the actual code and the ideal code for the shorted signal is due to offset error in the ADC 402. The offset calibration circuit 602 stores the offset error for use in compensating subsequent output codes.

To initiate gain calibration, the control logic 608 causes the multiplexer 405 to select the reference voltage as input to the ADC 402. The gain calibration circuit 604 is configured to compensate the digital output of the ADC 402 for gain error. Error at the output of the ADC 402 is given by:

$$\text{Code Out} = (V_{IN}\text{Gain} + \text{offset}) * 2^N,$$

where $V_{IN}$ is the analog input voltage, "Gain" is the gain of the ADC 402, and "offset" is the offset of the ADC 402. The offset is compensated by the offset calibration circuit 602 as described above. Since the reference voltage is known, an ideal output code for the reference voltage is known. The gain of the ADC 402 is the ratio of the actual output code when converting the reference voltage (after offset correction) to the ideal output code for the reference voltage (i.e., slope of the actual transfer function of the ADC 402). Given the gain, a gain correction factor (GCF) can be defined as 1/gain. The gain calibration circuit 604 stores the GCF value and multiplies each subsequent output code by the GCF value to compensate for gain. That is, the output code provided by the gain calibration circuit 604 is given by:

$$\text{Calibrated Code Out} = (\text{code out} - \text{offset code}) * GCF,$$

where "code out" is the output code produced by the ADC 402, and "offset code" is the code that equates to the offset error determined by the offset calibration circuit 602.

The gain may be measured with the ADC 402 in either bipolar or unipolar mode. Unipolar mode is best suited for measuring gain, as the magnitude of gain errors when measured at the upper extreme of the transfer function are twice as large as for bipolar mode, which allows for easier detection of the error. Thus, in one embodiment, the control logic 608 causes the ADC 402 to be in unipolar mode for measuring gain.

After the offset and gain have been calibrated, the control logic 608 causes the multiplexer 405 to select the analog input voltage, $V_{IN}$. Having determined the offset and gain of the ADC 402, the digital calibration circuit 406 may compensate each output code produced for offset and gain. In this exemplary embodiment, the digital calibration circuit 406 is capable of providing an output code compensated for both offset and gain (i.e., the output of the gain calibration circuit 604), an output code compensated for just offset (i.e., the output of the offset calibration circuit 602), or an output code directly produced by the ADC 402 (i.e., uncompensated for both offset and gain). The selection of compensated for gain and offset, compensated for offset, and uncompensated output is determined by the cal_enable control signal to the multiplexer 606.

In the form described above, computation of the GCF requires a divide operation, which is expensive to realize in hardware (e.g., in terms of area on an integrated circuit device). Moreover, all subsequent codes must be multiplied by the GCF. In the form described above, computation of the calibrated output code requires a signed multiplication operation, which is also expensive to realize in hardware. The maximum gain error of an ADC, however, will lie within certain bounds, related to the matching of the analog components and the architecture of the ADC. Given that the gain error of an ADC is within a limited range, the digital circuitry of the digital calibration circuit 406 may be minimized.

Figure 7:
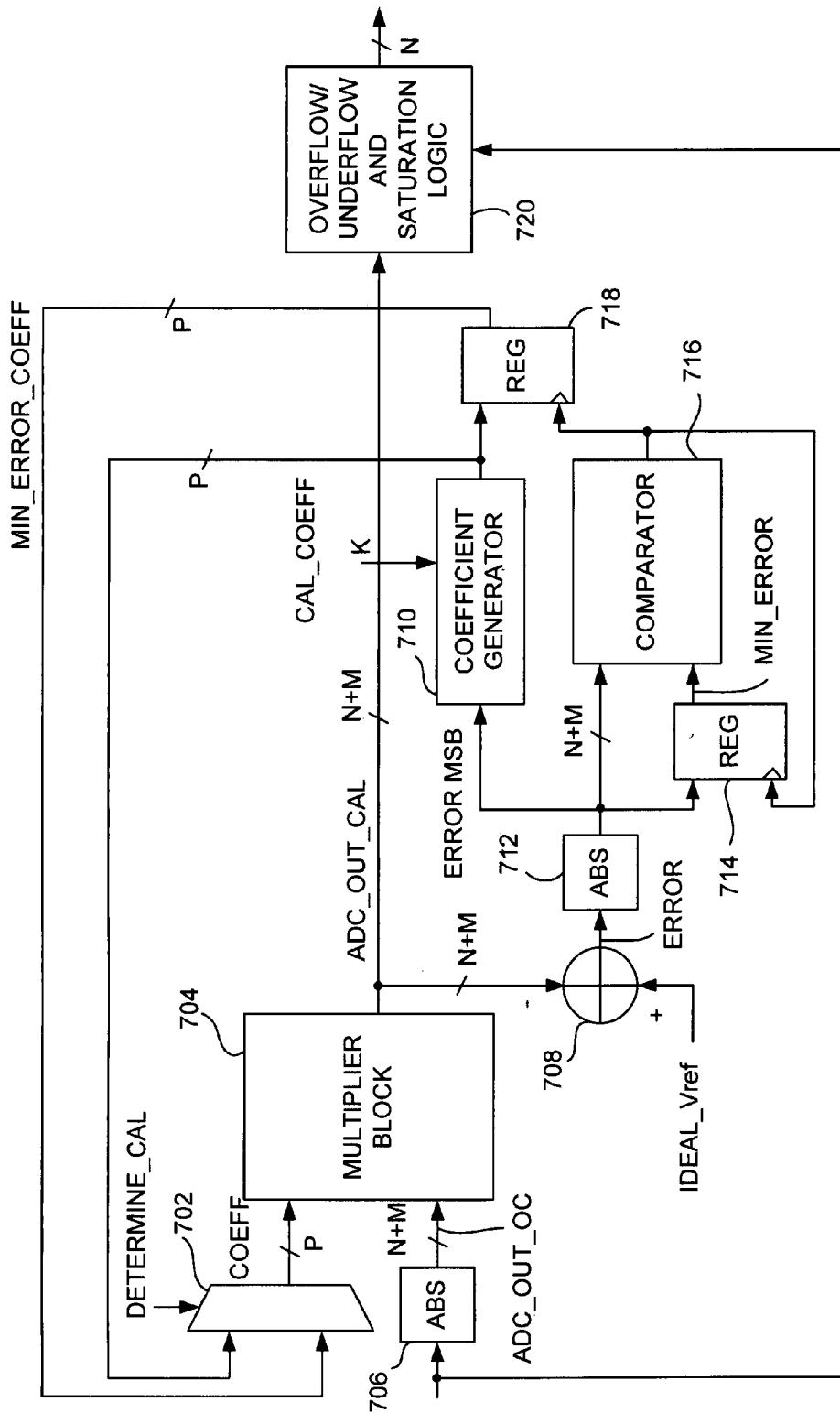
FIG. 7 is a block diagram depicting an exemplary embodiment of a gain calibration circuit in accordance with one or more aspects of the invention.

In particular, FIG. 7 is a block diagram depicting an exemplary embodiment of the gain calibration circuit 604 in accordance with one or more aspects of the invention. The gain calibration circuit 604 includes a multiplexer 702, a multiplier block 704, an absolute value circuit 706 (labeled "ABS"), a subtractor 708, a coefficient generator 710, an absolute value circuit 712, a register 714, a comparator 716, a register 718, and overflow/underflow and saturation logic 720. An input of absolute value circuit 706 is configured to receive the offset corrected output of the ADC 402 (generated by the offset calibration circuit 602). An output of the absolute value circuit 706 is coupled to an input of the multiplier block 704. The output of the absolute value circuit 706 is referred to as ADC_out_oc and is an N+M bit signal.

As discussed below, the gain calibration circuit 604 compensates for gain in the ADC 402 using an unsigned multiplication operation between the output of the ADC 402 and a positive coefficient. Use of an unsigned multiplier minimizes area overhead in an implementation of the gain calibration circuit 604. If the ADC 402 is configured in bipolar mode, the output codes may be positive or negative. In order to use unsigned multiplication, the absolute value of the output code is computed. The sign of the ADC output is represented in the MSB thereof (ADC_OUT_OC MSB), which is coupled to the overflow/underflow and saturation logic 720. The overflow/underflow and saturation logic 720 will account for the sign of the ADC input in the gain calibrated output code. The hardware used to implement the absolute value circuit 706 may be reduced, given that the ADC 402 is producing the M extra bits, which are sub-LSB bits with respect to the N-bit gain calibrated output code. A full sign conversion requires each bit to be inverted and then adding one to the result. The absolute value circuit 706, however, may be configured to only invert the bits in case of a sign conversion, as adding one at the N+M bit level is insignificant at the N bit level.

An output of the multiplexer 702 is coupled to another input of the multiplier block 704. The output of the multiplexer 702 is referred to as "coeff" (coefficient) and is a P-bit signal, where P is greater than one. An output of the multiplier block 704 is coupled to an input of the subtractor 708 and an input of the overflow/underflow and saturation logic 720. The output of the multiplier block 704 is referred to as ADC_out_cal and is an N+M bit signal. Another input of the subtractor 708 is configured to receive the ideal output code for the reference voltage, referred to as ideal_$V_{REF}$.

An output of the subtractor 708 is coupled to an input of the absolute value circuit 712. The absolute value circuit 712 may be configured similarly to the absolute value circuit 706, for example. The output of the subtractor 708 is referred to as error and is an N+M bit signal. The MSB of error (i.e., the sign bit) is coupled to an input of the coefficient generator 710. An output of the absolute value circuit 712 is coupled to an input of the comparator 716 and a data input of the register 714. A data output of the register 714 (referred to as min_error) is coupled to another input of the comparator 716. An output of the comparator 716 is coupled to an enable input of the register 714 and an enable input of the register 718. An output of the register 718 (referred to as min_error_coeff) is coupled to an input of the multiplexer 702. An output of the coefficient generator 710 is coupled to a data input of the register 718 and another input of the multiplexer 702. An output of the overflow/ underflow and saturation logic 720 provides an offset and gain calibrated output for the ADC 402.

As discussed above, the gain error of the ADC 402 is limited to a particular range. For example, an ADC 402 of a particular design may have a maximum gain error of ±6%. In such case, the gain error of the ADC 402 is between a maximum of 1.06 and a minimum of 0.94 times the ideal reference voltage. In general, assume the gain error of the ADC 402 is within a fractional range centered on one such that the GCF, which is the inverse of the slope, is also within a fractional range centered on one. As such, if the GCF is greater than one, the GCF can be expressed as (1+GCF_fraction); and if the GCF is less than one, the GCF can be expressed as (1−GCF_fraction).

The output of the multiplexer 702, coeff, provides the GCF_fraction. The multiplier block 704 computes the sum/difference of ADC_out_oc and ADC_out_oc times coeff (ADC_out_oc*coeff). That is, the multiplier block 704 computes:

ADC_out_oc*(1±coeff).

The multiplier block 704 performs an unsigned multiplication operation followed by a sum/difference operation. ADC_out_oc is always positive, being output by the absolute value circuit 706. In an embodiment, coeff is in sign-magnitude format, where the MSB denotes the sign and the remaining LSBs (P−1 bits) denote the magnitude. The magnitude portion of coeff is multiplied by ADC_out_oc. That is, the multiplier block 704 includes an (N+M)×P−1 multiplier. The sign bit in coeff determines whether the multiplier block 704 performs a sum or difference operation after the multiplication operation. An unsigned multiplier minimizes the required area for implementing the multiplier block 704 as compared to a signed multiplier. An exemplary embodiment of the multiplier block 704 is described below with respect to FIG. 9.

Since the multiplier block 704 has a limited range, the necessity to implement a divider to determine the value of coeff can be avoided. Instead, the gain calibration circuit 604 in the present embodiment employs a binary search algorithm to check for minimum error for all possible values of coeff in just log$_2$(P) compare periods. This also results in a large area saving when implementing the gain calibration circuit 604. The subtractor 708, the register 714, the comparator 716, the coefficient generator 710, and the register 718 collectively comprise binary search logic. The binary search logic is configured to iteratively determine a value for the GCF fraction (min_error_coeff) that results in a minimum error between ADC_out_cal and ideal_$V_{REF}$.

Figure 8:
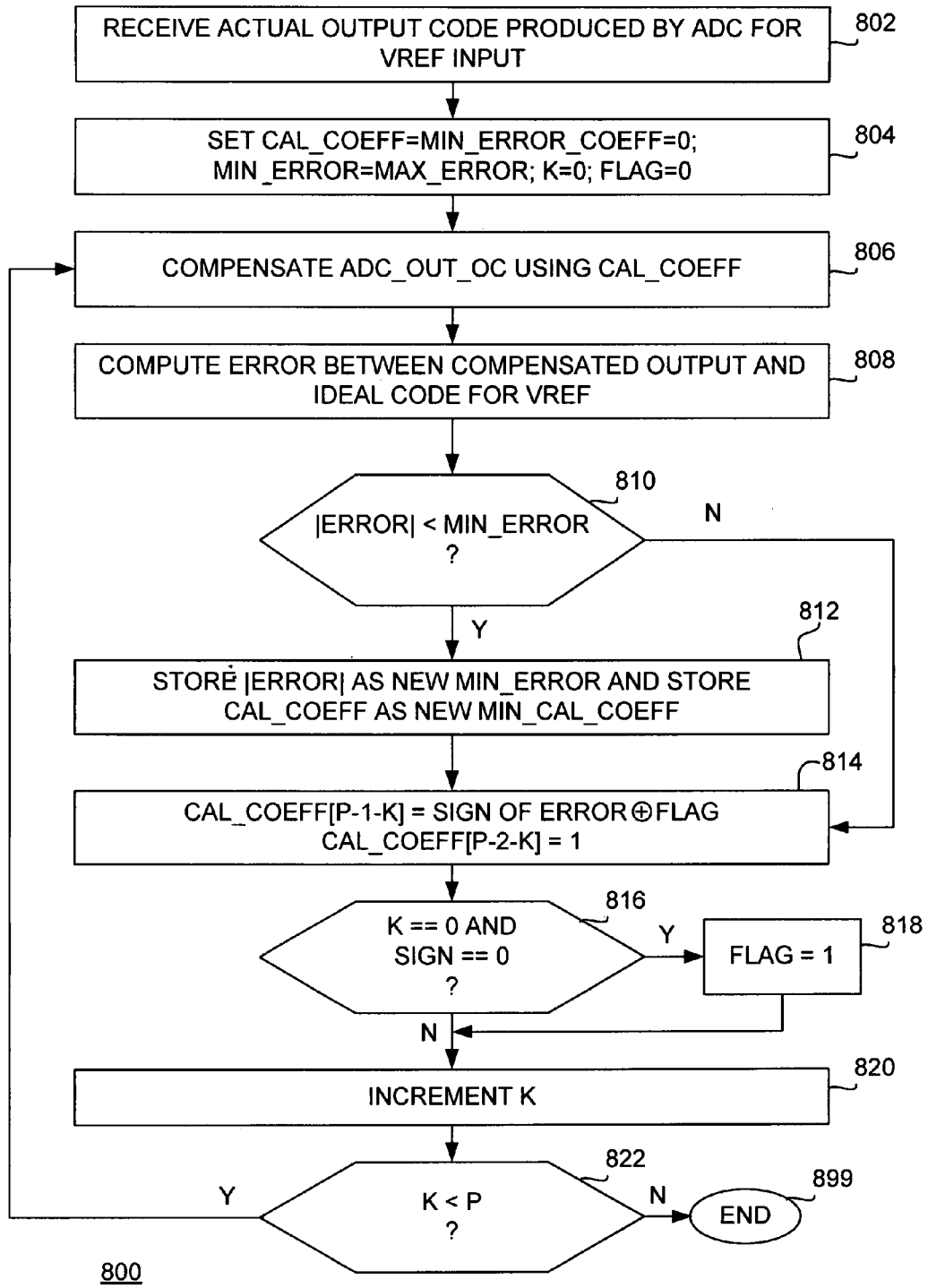
FIG. 8 is a flow diagram depicting an exemplary embodiment of a method for determining a gain correction factor for use in compensating output of an ADC in accordance with one or more aspects of the invention.

In particular, FIG. 8 is a flow diagram depicting an exemplary embodiment of a method 800 for determining a gain correction factor for use in compensating output of the ADC 402. The method 800 is performed by the gain calibration circuit 604 shown in FIG. 7 during the gain calibration phase. As discussed above, during the gain calibration phase, the control logic 608 causes the reference voltage to be input to the ADC 402. Thus, ADC_out_oc is the actual output code produced by the ADC 402 for $V_{REF}$ corrected for offset. The goal of the gain calibration circuit 604 is to find a value of coeff (GCF_fraction) that minimizes the error between ADC_out_cal and ideal_$V_{REF}$. When gain calibration is initiated, the control logic 608 drives the multiplexer 702 to select the output of the coefficient generator 710 (cal_coeff). The coefficient generator 710 generates values of cal_coeff over multiple iterations until error between ADC_out_cal and ideal_$V_{REF}$ is minimized. The cal_coeff that results in minimum error is stored in the register 718 as min_error_coeff. After gain calibration, the control logic 608 drives the multiplexer 702 to select min_error_coeff output by the register 718. Thus, each subsequent output code from the ADC 402 is compensated using the determined gain correction factor.

At step 802, the actual output code produced by the ADC 402 for $V_{REF}$ is received (ADC_out_oc). At step 804, the gain calibration circuit 604 is initialized. The coefficient generator 710 generates a value for cal_coeff for each Kth interation, where K equals 0, 1, 2, . . . , P–1. The control logic 608 initially sets K to zero. The coefficient generator 710 initially sets the bits of cal_coeff to zero. The register 718 stores min_error_coeff, which is initially set equal to cal_coeff. The register 714 stores min_error, which is initially set to a maximum error value. A flag is also set to zero.

At step 806, the multiplier block 704 compensates ADC_out_oc in accordance with cal_coeff generated by the coefficient generator 710. In the first iteration (K=0), cal_coeff is zero and the multiplier block 704 outputs ADC_out_oc (i.e., ADC_out_cal=ADC_out_oc). At step 808, the subtractor 708 subtracts ADC_out_cal from ideal_$V_{REF}$ to compute a value for error. The value of error may be positive or negative and hence error is a signed value.

At step 810, a determination is made whether the absolute value of error is less than min_error. Notably, the comparator 716 compares the absolute value of error to min_error stored in the register 714. If the absolute value of error is less than min_error, the comparator 716 generates a logic high (1). Otherwise, the comparator 716 generates a logic low (0). As such, if the absolute value of error is less than min_error, the method 800 proceeds to step 812. At step 812, the register 714 is enabled and error is stored in the register 714 as a new min_error. In addition, the register 718 is enabled and the value of cal_coeff associated with the min_error is stored in the register 718. If at step 810 the absolute value of error is greater than min_error, the method 800 proceeds to step 814. The registers 714 and 718 are not enabled and do not record new values for min_error and min_error_coeff, respectively.

At step 814, the value of cal_coeff is updated for the next iteration. In particular, the sign of the error (i.e., the MSB of error) is provided to the coefficient generator 710. The sign of the error is indicative of whether the ideal_$V_{REF}$ is greater than or less than ADC_out_cal (i.e., error is 0 if ideal_$V_{REF}$>ADC_out_cal, and error is 1 if ideal_$V_{REF}$<ADC_out_cal). Cal_coeff includes P-bits (LSB bit 0 to MSB bit P–1). The value of cal_coeff [P–1–K] is set equal to the exclusive OR of the sign value and the flag. In the first iteration (K=0), the flag is initialized to 0 and thus the value of cal_coeff [P–1] is equal to the sign or the error. This determines whether the multiplier block 704 will perform addition or subtraction following the multiplication operation.

Notably, if the error in iteration K=0 is positive, then ideal_$V_{REF}$ is greater than ADC_out_oc, which means the slope of the actual transfer function is less than the slope of the ideal transfer function. The GCF is thus greater than one (i.e., ADC_out_oc must be multiplied by a number greater than one to reach ideal_$V_{REF}$). As described above, for GCF>1, GCF is expressed as 1+GCF_fraction. As such, the multiplier block 704 is configured to compute ADC_out_oc*(1+coeff). If, on the other hand, the error in iteration K=0 is negative, then ideal_$V_{REF}$ is less than ADC_out_oc, which means the slope of the actual transfer function is greater than the slope of the ideal transfer function. The GCF is thus less than one (i.e., ADC_out_oc must be multiplied by a number less than one to reach ideal_$V_{REF}$). For GCF<1, GCF is expressed as 1-GCF_fraction. As such, the multiplier block 704 is configured to compute ADC_out_oc*(1−coeff).

As described above, the gain calibration circuit 604 performs a binary search algorithm, which is implemented as follows. At step 814, in addition to setting cal_coeff [P–1–K] as described above, the value of cal_coeff [P–2–K] is set equal to logic high (1). The remaining bits in cal_coeff are left unchanged. This new value of cal_coeff is then used in the next iteration to compensate ADC_out_oc. Assume, for example, K=1. Then, in the previous iteration, cal_coeff [P–2] was set equal to 1. In the present iteration, whether cal_coeff [P–2] remains at 1 or cleared to 0 depends on whether cal_coeff is positive or negative and whether ideal_$V_{REF}$ is greater than or less than ADC_out_cal.

Assume cal_coeff is positive. Then, the slope of the actual transfer function is less than the slope of the ideal transfer function. If ideal_$V_{REF}$ is greater than ADC_out_cal, then the slope of the corrected transfer function in this iteration is still less than the slope of the ideal transfer function. To increase the slope of the corrected transfer function towards the ideal transfer function, cal_coeff needs to be a larger value. As such, if ideal_$V_{REF}$ is greater than ADC_out_cal, then cal_coeff [P–2] remains set equal to 1. If, on the other hand, ideal_$V_{REF}$ is less than ADC_out_cal, then the slope of the corrected transfer function in this iteration is greater than the slope of the ideal transfer function. The value of cal_coeff was too large. As such, if ideal_$V_{REF}$ is less than ADC_out_cal, then cal_coeff [P–2] is cleared to logic low (0).

Now assume cal_coeff is negative. Then the slope of the actual transfer function is greater than the slope of the ideal transfer function. If ideal_$V_{REF}$ is less than ADC_out_cal, then the slope of the corrected transfer function in this iteration is still greater than the slope of the ideal transfer function. To increase the slope of the corrected transfer function towards the ideal transfer function, cal_coeff needs to be a larger value. As such, if ideal_$V_{REF}$ is less than ADC_out_cal, then cal_coeff [P–2] remains set equal to 1. If, on the other hand, ideal_$V_{REF}$ is greater than ADC_out_cal, then the slope of the corrected transfer function in this iteration is less that the slope of the ideal transfer function. The value of cal_coeff was too large. As such, if ideal_$V_{REF}$ is greater than ADC_out_cal, then cal_coeff [P–2] is cleared to logic low (0)

The aforementioned behavior is handled by setting cal_coeff [P−2] equal to the exclusive OR (XOR) of the sign value and the flag. As described below, the flag is zero if cal_coeff is negative, and one if cal_coeff is positive. In general, if cal_coeff is negative, then cal_coeff [P−1−K] is set equal to the sign of the error. If cal_coeff is positive, then cal_coeff [P−1−K] is set equal to the inverse of the sign of the error.

At step 816, a determination is made whether K is equal to zero and the sign of the error is positive (equal to 0). If so, the method 800 proceeds to step 818, where the flag is set equal to 1. The method 800 then proceeds to step 820. If at step 816 K is not equal to zero or the sign of the error is negative, the method 800 proceeds directly to step 820 (i.e., the flag is not changed). At step 820, the value if K is incremented. At step 822, a determination is made whether K is less than P. If so, the method 800 returns to step 806 and repeats. Otherwise, the method 800 ends at step 899. At the end of method 800, the register 718 stores a value for min_error_coeff that generated the minimum error between ADC_out_cal and ideal_$V_{REF}$. This value is then used by the multiplier block 704 to compensate all subsequent output codes produced by the ADC 402.

The overflow/underflow and saturation logic 720 handles overflow and underflow for ADC_out_cal. In particular, overflow/underflow and saturation logic 720 drops the M LSBs to output an N-bit offset and gain compensated code. The overflow/underflow and saturation logic 720 also handles the sign of the output code if the ADC 402 is in bipolar mode, as discussed above (i.e., if ADC_out_oc was initially negative, the sign of the compensated output code is changed to negative).

The gain calibration circuit 604 of FIG. 7 can be parameterized for range, accuracy, and area optimization. For example, if the output of the system is 10-bits wide (N=10) and the output of the ADC 402 is 16-bits (M=6), then the input to the multiplier block 704 is N+M or 16 bits. This is necessary to achieve a reduction in DNL introduced by the digital gain compensation to $\frac{1}{64}$ of an LSB. This error reduction, however, can be traded off against area. For example, the multiplier block 704 can be configured to be 14-bits wide (i.e., M=4), but with a DNL error of just $\frac{1}{16}$ of an LSB. Also, the resolution of the gain calibration accuracy in terms of percentage can also be traded off versus implementation area. For example, correction of a 10-bit ADC (N=10) that has a maximum gain error of approximately ±6% to an accuracy of approximately 0.2%, a multiplier depth (P) of ceiling($\log_2(6/0.2)$) or 5 bits is required. If the range is reduced to approximately ±3% (i.e., it is known that the worse case error due to analog circuitry will not fall outside this range), the accuracy can be doubled to approximately 0.1% and the same multiplier can be used with no change in implementation area. Alternatively, the same accuracy may be maintained (approximately 0.2%) and the multiplier depth (P) can be reduced by 1 bit. In this manner, the gain calibration circuit 604 can be tailored to meet analog gain accuracy, DNL impact error, and area required for implementation.

Figure 9:
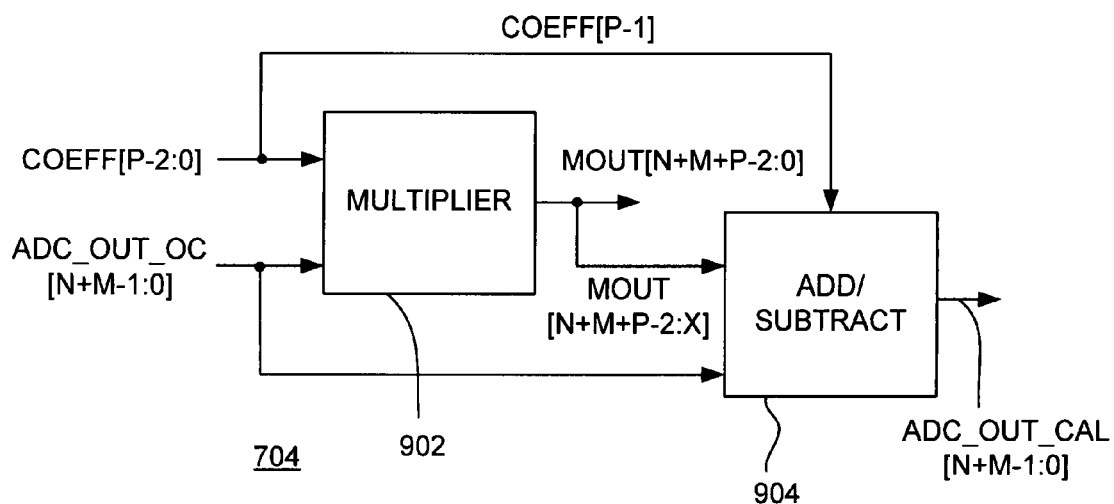
FIG. 9 is a block diagram depicting an exemplary embodiment of a multiplier block in accordance with one or more aspects of the invention.

FIG. 9 is a block diagram depicting an exemplary embodiment of the multiplier block 704 in accordance with one or more aspects of the invention. The multiplier block 704 includes a multiplier 902 and an adder 904. Inputs of the multiplier 902 receive ADC_out_oc and the magnitude of coeff (coeff [P−2:0]), respectively. An output of the multiplier 902 (referred to as MOUT) provides an N+M+P−2 bit signal. One input of the adder 904 receives ADC_out_oc. Another input of the adder 904 receives X MSBs of the output of the multiplier 902. A control input of the adder 904 receives the MSB (sign) of coeff (coeff [P−1]). If the sign is positive, the adder 904 computes a sum of MOUT and ADC_out_oc. If the sign is negative, the adder 904 subtracts MOUT from ADC_out_oc:

For example, assume N=10, M=6, P=6, and X=12. Thus, ADC_out_oc is a 16-bit signal, ADC_out_oc[15:0]. Coeff is a 6-bit signal, coeff [5:0]. The multiplier 902 multiplies ADC_out_oc[15:0] and coeff [4:0]. MOUT is a 21-bit signal, MOUT[20:0]. The adder 904 computes the sum/difference of MOUT[20:9] (i.e., 12 MSBs of MOUT) and ADC_out_oc[15:0]. The value of coeff [5] is used to determine the operation of the adder 904.

Figure 10:
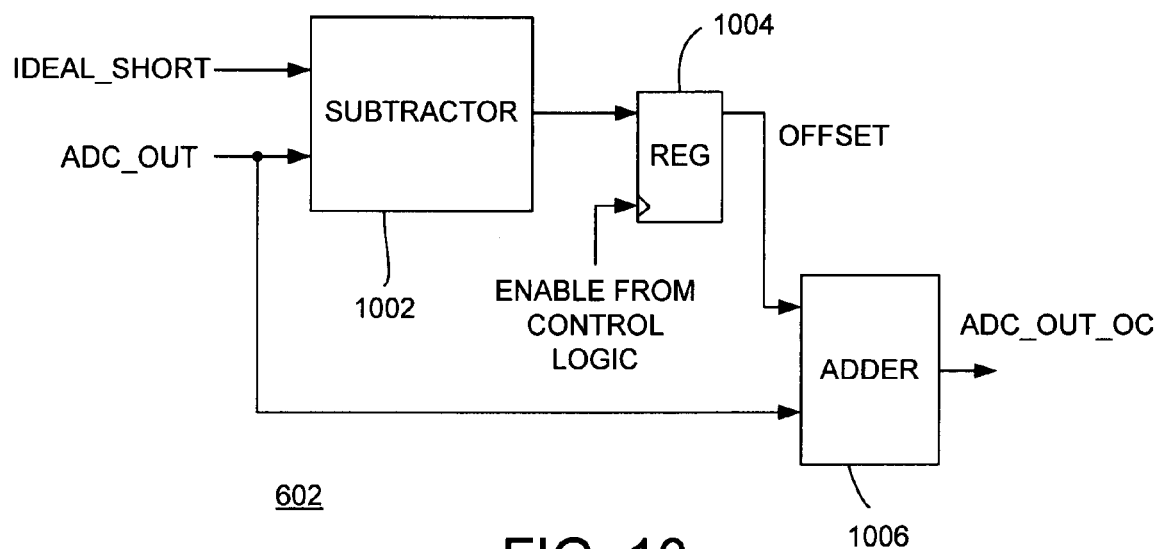
FIG. 10 is a block diagram depicting an exemplary embodiment of an offset calibration circuit in accordance with one or more aspects of the invention.

FIG. 10 is a block diagram depicting an exemplary embodiment of the offset calibration circuit 602 in accordance with one or more aspects of the invention. The offset calibration circuit 602 includes a subtractor 1002, a register 1004, and an adder 1006. Inputs of the subtractor 1002 are configured to receive the output of the ADC 402 (ADC_out) and an ideal output code for the shorted input signal (ideal_short). An output of the subtractor 1002 is coupled to a data input of the register 1004. An enable input of the register 1004 is configured to receive a control signal from the control logic 608. A data output of the register 1004 is coupled to an input of the adder 1006. Another input of the adder 1006 is configured to receive ADC_out.

The subtractor 1002 subtracts ADC_out from ideal_short. The control logic 608 enables the register 1004 when in the offset calibration mode. Thus, the register 1004 stores a difference between ADC_out and ideal_short as an offset value. After the offset calibration mode, the control logic 608 disables the register 1004. For each output code produced by the ADC 402, the adder 1006 adds/subtracts an offset value stored in the register 1004. The adder 1006 produces an offset corrected output of the ADC 402.

Figure 11:
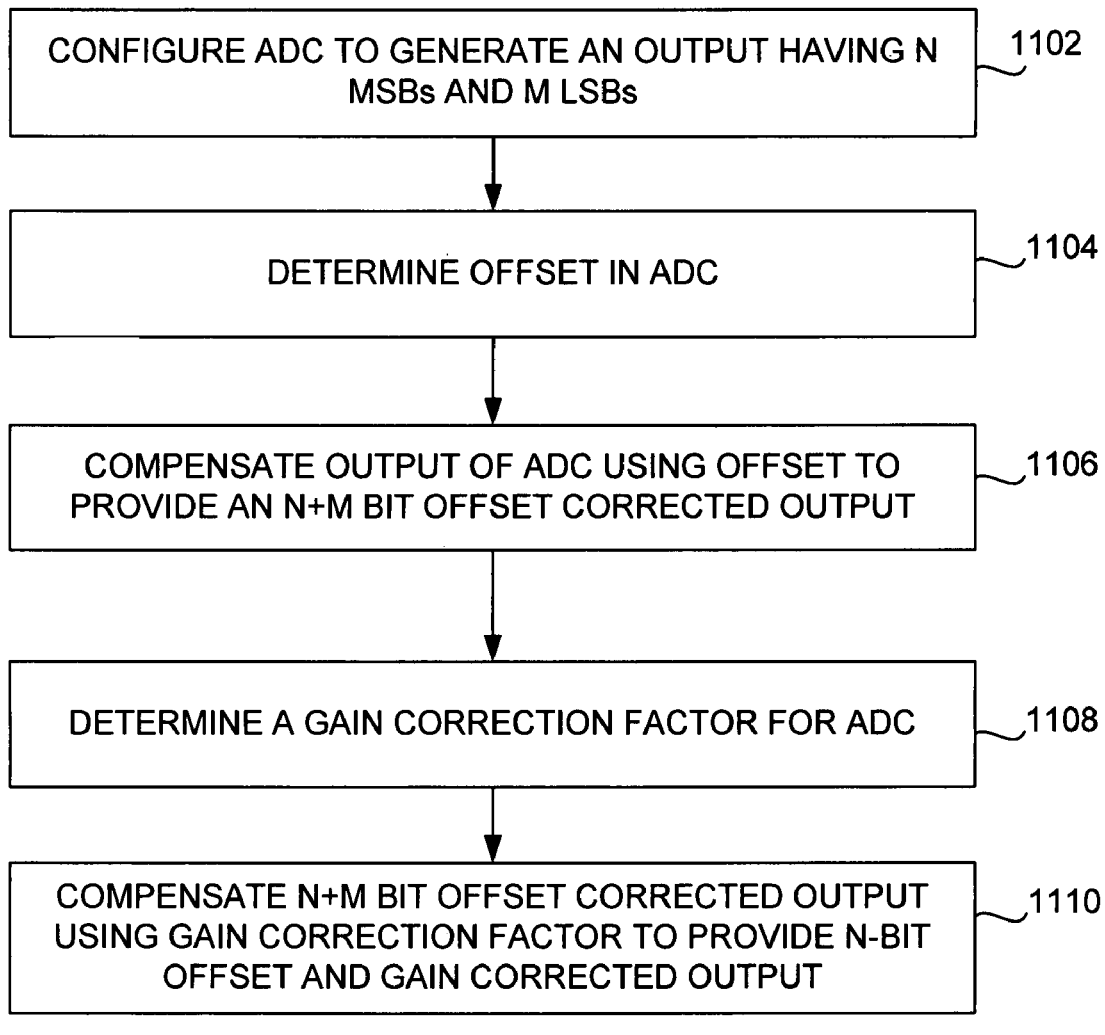
FIG. 11 is a flow diagram depicting an exemplary embodiment of a method for calibrating an A/D conversion system having an N-bit resolution in accordance with one or more aspects of the invention.

FIG. 11 is a flow diagram depicting an exemplary embodiment of a method 1100 for calibrating an A/D conversion system having an N-bit resolution in accordance with one or more aspects of the invention. The method 1100 begins at step 1102, where an output is generated at an ADC having N MSBs and M LSBs. That is, an ADC is configured to generate an N+M bit output. At step 1104, an offset is determined in the ADC. In one embodiment, the offset is determined by selecting a shorted signal input to the ADC. An output code produced by the ADC after converting the shorted signal input is compared to an ideal output code for the shorted signal input. The offset is determined based on results of the comparison.

At step 1106, the output of the ADC is compensated using the offset to provide an N+M bit offset corrected output. The output of the ADC may be corrected for offset error by summing the output with the offset determined in step 1104 (the offset is a signed value that may be positive or negative). At step 1108, a gain correction factor is determined for the ADC. At step 1110, the N+M bit offset corrected output is compensated using the gain correction factor to provide an N-bit offset and gain corrected output.

In one embodiment, the fact that the ADC has a maximum gain error within a certain range is used to define the gain correction factor as one plus a signed fractional portion (the signed fractional portion may be positive or negative). The N+M bit offset corrected output may be compensated by computing the product of the N+M bit offset corrected output and the signed fractional portion, and summing the product with the N+M bit offset corrected output. The fractional portion of the gain correction factor may be determined using the algorithm described above with respect to FIG. 8.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. An apparatus for calibrating an analog-to-digital (A/D) conversion system having an N-bit resolution, the apparatus comprising:
   an analog-to-digital converter (ADC) configured to generate an output having N most significant bits (MSBs) and M least significant bits (LSBs), where N and M are integers greater than zero;
   an offset calibration circuit coupled to the ADC, the offset calibration circuit being configured to determine an offset in the ADC and compensate the output of the ADC using the offset to provide an N+M bit offset corrected output; and
   a gain calibration circuit coupled to the offset calibration circuit, the gain calibration circuit being configured to determine a gain correction factor for the ADC, and compensate the N+M bit offset corrected output using the gain correction factor to provide an N bit offset and gain corrected output.

2. The apparatus of claim 1, further comprising:
   control logic configured to:
      select a shorted signal input to the ADC and control the offset calibration circuit to determine the offset based on an output code produced by the ADC after converting the shorted signal input; and
      select a reference voltage input to the ADC and control the gain calibration circuit to determine the gain correction factor based on an output code produced by the ADC after converting the reference voltage input.

3. The apparatus of claim 2, wherein the gain correction factor includes a signed fractional portion, and wherein the gain calibration circuit includes a multiplier block configured to determine a sum of the N+M bit offset corrected output and a product of the N+M bit offset corrected output and the signed fractional portion.

4. The apparatus of claim 3, wherein the multiplier block includes an unsigned multiplier coupled to an adder.

5. The apparatus of claim 3, wherein the gain calibration circuit comprises:
   a subtractor configured to subtract an output of the multiplier block from an ideal code for the reference voltage to generate an error;
   a first register configured to store a minimum error;
   a comparator configured to compare an absolute value of the error with the minimum error;
   a coefficient generator configured to generate values for the signed fractional portion of the gain correction factor; and
   a second register configured to store one of the values for the signed fractional portion corresponding with the minimum error.

6. An analog-to-digital (A/D) conversion system having an N-bit resolution, the conversion system comprising:
   an analog-to-digital converter (ADC) having an analog input and an output having N most significant bits (MSBs) and M least significant bits (LSBs), where N and M are integers greater than zero;
   an offset calibration circuit having an input, a control input, and an output, the input of the offset calibration circuit being coupled to the output of the ADC, the output of the offset calibration circuit having a width of N+M bits;
   a gain calibration circuit having an input, a control input, and an output, the input of the gain calibration circuit being coupled to the output of the offset calibration circuit, the output of the gain calibration circuit having a width of N bits; and
   control logic coupled to the control input of the offset calibration circuit and the control input of the gain calibration circuit.

7. The conversion system of claim 6, further comprising:
   an analog multiplexer having a control input, a first input, a second input, a third input, and an output, the first input configured to receive an input analog voltage, the second input being shorted, the third input configured to receive a reference voltage, and the output being coupled to the analog input of the ADC; and
   wherein the control logic is coupled to the control input of the analog multiplexer.

8. The conversion system of claim 7, wherein the control logic is configured to:
   drive the analog multiplexer to select the second input and control the offset calibration circuit to determine the offset based on an output code produced by the ADC after converting the second input; and
   drive the analog multiplexer to select the third input and control the gain calibration circuit to determine the gain correction factor based on an output code produced by the ADC after converting the third input.

9. The conversion system of claim 6, wherein the gain calibration circuit comprises:
   a multiplexer having a first input, a second input, a control input, and an output, the control input of the multiplexer being coupled to the control logic;
   a multiplier block having a first input, a second input, and an output, the first input of the multiplier block being coupled to the output of the multiplexer, the second input of the multiplier block being coupled to the output of the offset calibration circuit; and
   binary search logic having a first input, a second input, a first output, and a second output, the first input of the binary search logic being coupled to the output of the multiplier block, the second input of the binary search logic being configured to receive an ideal code for a reference voltage, the first output of the binary search logic being coupled to the first input of the multiplexer, and the second output of the binary search logic being coupled to the second output of the multiplexer.

10. The conversion system of claim 9, wherein the binary search logic comprises:
   a subtractor having inputs respectively coupled to the first and second inputs of the binary search logic and an output;
   a first register having a data input, an enable input, and an output, the data input of the first register coupled to the output of the subtractor;
   a comparator having a first input, a second input, and an output, the first input of the comparator being coupled to the output of the subtractor, the second input of the comparator being coupled to the output of the first register, the output of the comparator being coupled to the enable input of the first register;

a coefficient generator having an input and an output, the input of the coefficient generator configured to receive a most significant bit (MSB) of the output of the subtractor, the output of the coefficient generator being coupled to the first output of the binary search logic; and a second register having a data input, an enable input, and an output, the data input of the second register being coupled to the output of the coefficient generator, the enable input of the second register being coupled to the output of the comparator, and the output of the second register being coupled to the second output of the binary search logic.

11. The conversion system of claim 9, further comprising: overflow/underflow and saturation logic coupled to the output of the multiplier block and configured to receive a most significant bit (MSB) of the output of the offset calibration circuit.

12. The conversion system of claim 9, further comprising: an absolute value circuit coupled between the output of the ADC and the second input of the multiplier.

13. The conversion system of claim 12, wherein the absolute value circuit is configured to invert bits of the output of the ADC without adding one if the output of the ADC is negative.

14. The conversion system of claim 9, wherein the gain correction factor includes a signed fractional portion, and wherein the multiplier block is configured to determine a sum of the output of the offset calibration circuit and a product of the output of the offset calibration circuit and the signed fractional portion.

15. The conversion system of claim 14, wherein the multiplier block includes an unsigned multiplier coupled to an adder.

16. A method of calibrating an analog-to-digital (A/D) conversion system having an N-bit resolution, the method comprising:

generating, at an analog-to-digital converter (ADC), an output having N most significant bits (MSBs) and M least significant bits (LSBs), where N and M are integers greater than zero;

determining an offset in the ADC;

compensating an output of the ADC using the offset to provide an N+M bit offset corrected output;

determining a gain correction factor for the ADC; and compensating the N+M bit offset corrected output using the gain correction factor to provide an N bit offset and gain corrected output.

17. The method of claim 16, wherein determining the offset in the ADC comprises:

selecting a shorted signal input to the ADC;

comparing an output code produced by the ADC after converting the shorted signal input to an ideal output code for the shorted signal input; and determining the offset based on results of the comparison.

18. The method of claim 17, wherein compensating the output of the ADC comprises:

summing the offset and the output of the ADC.

19. The method of claim 16, wherein the gain correction factor includes a signed fractional portion, and wherein compensating the N+M bit offset corrected output comprises:

computing product of the N+M bit offset corrected output and the signed fractional portion; and summing the product with the N+M bit offset corrected output.

20. The method of claim 19, wherein determining the gain correction factor comprises:

(a) selecting a reference voltage input to the ADC;

(b) assigning initial values to a coefficient, the fractional portion, and a minimum error;

(c) compensating the N+M bit offset corrected output using the coefficient to generate a calibrated output;

(d) computing an error between the calibrated output and an ideal code for the reference voltage;

(e) if an absolute value of the error is less than the minimum error, assigning the absolute value of the error to the minimum error and assigning the coefficient to the fractional portion;

(f) adjusting the coefficient; and (g) repeating steps (c) through (f) a plurality of times.

* * * * *